United States Patent [19]

Lindsay

[11] Patent Number: 4,866,213

[45] Date of Patent: Sep. 12, 1989

[54] END CLIP FOR MESH-CLAD RFI/EMI SHIELDING STRIPS AND SHIELDING STRIP ASSEMBLY INCLUDING SAME

[75] Inventor: Tom E. Lindsay, Palo Alto, Calif.

[73] Assignee: Pawling Corporation, Pawling, N.Y.

[21] Appl. No.: 153,849

[22] Filed: Feb. 8, 1988

[51] Int. Cl.[4] .............................................. H05K 9/00
[52] U.S. Cl. .................... 174/35 GC; 24/336; 24/350; 24/370; 24/546; 24/563
[58] Field of Search ......... 174/35 GC, 40 CC, 163 F; 24/336, 339, 350, 370, 377, 546, 563; 49/488, 490, 491, 493; 52/712, 714, 717, 718; 248/72, 74.2, 231.8, 316.7, 500, 505, 510; 277/189

[56] References Cited

U.S. PATENT DOCUMENTS

| | | | |
|---|---|---|---|
| 1,464,731 | 8/1923 | Smith | 248/231.8 X |
| 1,746,942 | 2/1930 | Hise | 24/370 X |
| 2,230,923 | 2/1941 | Barry | 248/500 X |
| 2,831,723 | 4/1958 | Adell | 49/490 X |
| 2,916,113 | 12/1959 | Lee | 24/563 X |
| 3,252,679 | 5/1966 | Bell | 248/500 X |
| 4,652,695 | 3/1987 | Busby | 174/35 GC |

FOREIGN PATENT DOCUMENTS

| | | | |
|---|---|---|---|
| 804183 | 1/1969 | Canada | 174/163 F |
| 211589 | 3/1967 | Sweden | 24/563 |

Primary Examiner—Laramie E. Askin
Attorney, Agent, or Firm—Schweitzer & Cornman

[57] ABSTRACT

An end clip for attachment to the ends of finite strips of mesh-clad RFI/EMI shielding strips. A clip attachment is formed of a thin strip of metal, such as stainless steel, with hook-like flanges at opposite ends for securement to the edge margins of a mounting strip member of U-shaped cross section. The clip passes over the top of and partially compresses the end extremity of a tubular mesh-clad core strip mounted on the U-shaped strip. The end clip not only improves the appearance of the shielding strip end, but prevents possible snagging of the exposed tube end during use. A pointed tab, pressed out of the clip material, penetrates the core strip and resists accidental removal of the clip.

7 Claims, 3 Drawing Sheets

END CLIP FOR MESH-CLAD RFI/EMI SHIELDING STRIPS AND SHIELDING STRIP ASSEMBLY INCLUDING SAME

BACKGROUND AND SUMMARY OF THE INVENTION

The present invention relates to the subject of shielding strips, especially RFI/EMI shielding strips used widely in connection with the construction of cabinets for computer equipment, for example.

In connection with the design of cabinetry for computer equipment and the like, it is conventional practice to utilize shielding strip elements around the panel openings for such cabinetry, to prevent the escape of electromagnetic radiation. A particularly advantageous form of such shielding strip material is described and claimed in the Busby U.S. Pat. No. 4,652,695, owned by Pawling Corporation, Pawling, N.Y. The present invention is particularly applicable to shielding strip material of that type, but is not necessarily limited thereto.

The shielding strip illustrated in the Busby U.S. Pat. No. 4,652,695 comprises an elongated, more or less continuous mounting strip of clip-like configuration, formed of a conductive metal, such as stainless steel. The mounting strip is adapted to be attached to the edge of the sheet metal material forming a door or other panel opening for a typical computer cabinet.

Attached to the clip-like mounting strip is a continuous length of resilient core material, advantageously a hollow tubular core strip of a suitably resilient elastomeric material. A conductive metal mesh material is wrapped about the central core strip and is anchored to the clip-like mounting strip. Reference may be had to the before-mentioned Busby U.S. Pat. No. 4,652,695 for additional details of construction of a particularly preferred form of mesh-clad shielding strip. However, it is to be particularly understood, that the present invention is not limited to the strip illustrated and described in the Busby patent.

In a mesh-clad shielding strip, the mesh material advantageously is in the form of a knitted mesh of metallic yarn, such as soft "MONEL" wire. The knitted mesh material is either constructed about the resilient core strip in the first instance or, as in the before-mentioned Busby patent, is wrapped around the core after the knitting process.

Typically, mesh-clad shielding strips are manufactured in lengths significantly greater than those used in the production of shielded cabinets. Accordingly, subsequent to manufacturing, the shielding strips are cut to predetermined length for installation. The cutting operation leaves a relatively ragged end, which is not only unsightly, but results in many loose ends of the knitted wire, which can unravel, snag, etc. Accordingly, it has been typical practice to coat the severed ends of mesh-clad shielding strip with a suitable polymer composition, to seal the ragged ends of the mesh. This has proven to be an expensive and time-consuming operation.

In accordance with the present invention, a novel and improved end clip device is provided, which can be quickly snapped over the end of a cut shielding strip section to cover the unsightly ragged end of the mesh-clad core and also to effectively secure the mesh material against unraveling and/or snagging. Pursuant to the invention, the terminating clip is formed of a thin strip of resilient material, advantageously a suitable grade of stainless steel, which is extremely economical to produce and simple and easy to apply to the cut sections of shielding strip.

Pursuant to one aspect of the invention, the end clip may be in effect "wrapped" about the cut end of the shielding strip, partially compressing the mesh-clad core strip, advantageously to approximately one-half of its original height. In this respect, it is contemplated that, when the shielding strip is installed, it will be compressed somewhat upon closure of the door or panel on which it is installed, and the design of the end clip is such that it does not interfere with this process.

For a better understanding of the above and other features and advantages of the invention, reference should be made to the following detailed description of a preferred embodiment and to the accompanying drawings.

DESCRIPTION OF PREFERRED EMBODIMENTS OF THE INVENTION

Figure 1:
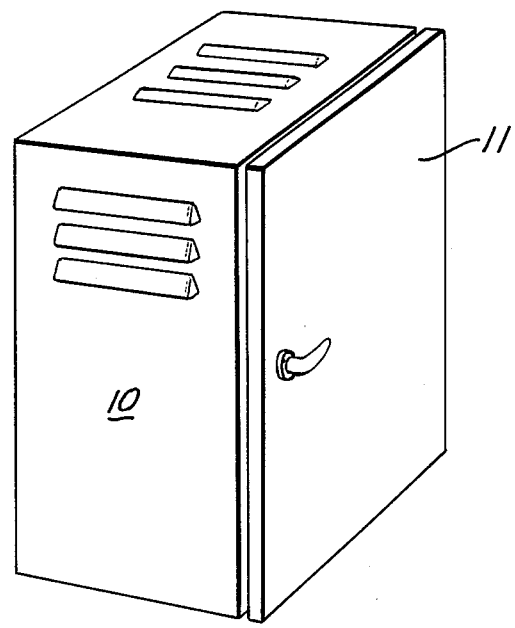
FIG. 1 is a perspective view of a typical computer cabinet structure of the type utilizing mesh-clad shielding strips.
Figure 2:
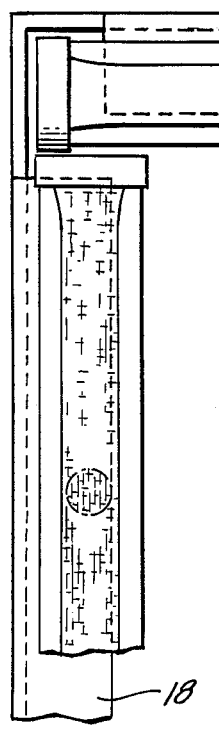
FIG. 2 is an enlarged, fragmentary view of a portion of the cabinet of FIG. 1, illustrating the manner in which the shielding strips are mounted and illustrating the end clips of the invention in place on the shielding strips.
Figure 4:
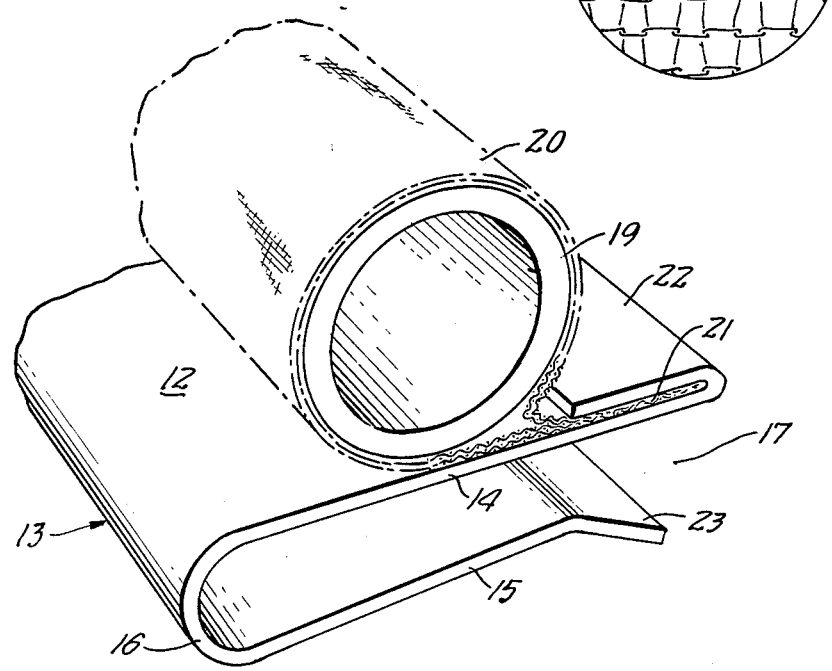
FIG. 4 is an enlarged, fragmentary, perspective view of a mesh-clad shielding strip of the type utilized in the structure of FIG. 2.

Referring now to the drawings, and initially to FIG. 1 thereof, there is shown an electronic cabinet 10 which is provided with an access door 11 arranged to be opened for access to the contents of the cabinet. In accordance with known techniques, the area around the access door 11 is shielded with a conductive metallic shielding strip, shown in FIG. 2, for example, and identified in general by the reference numeral 12. The construction of the shielding strip 12 is illustrated in FIG. 4, and reference may also be had to the Busby U.S. Pat. No. 4,652,695 for additional details. The shielding strip includes a mounting strip 13 of generally U-shaped cross section, having an upper strip section 14, a lower strip section 15, a closed edge 16 and an open edge 17. The mounting strip 13 is adapted to be applied over the edge of a flange 18 (see FIG. 2) in a manner to make good electrical contact therewith.

Extending along the upper section 14 of the mounting strip is a resilient core strip 19, advantageously formed of a tubular elastomeric material, but sometimes also formed of a section of resilient foam. The core strip 19 is enveloped by a conductive knitted mesh sleeve 20. In some constructions, the knitted sleeve is knitted progressively about the core strip 19. In the more advantageous structure of the before-mentioned Busby patent, the mesh sleeve 20 is formed by wrapping a double layer of knitted mesh material about the core 19, and securing the edges 21 of the mesh strip by a folded-over flange 22 formed at the edge of the upper strip section 14. At the open side 17 of the shielding strip, the lower section 15 of the mounting strip 13 advantageously is provided with a downwardly bent, divergent flange portion 23 to facilitate application of the shielding strip over the flange 18 of the housing.

Figure 3:
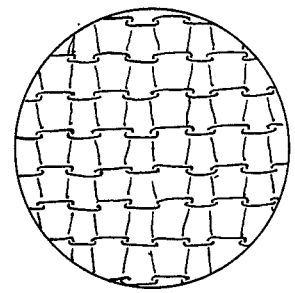
FIG. 3 is a highly enlarged, fragmentary view of the portion delineated in the circle in FIG. 2, illustrating the structure of the mesh shielding material incorporated on the shielding strip of FIG. 2.

FIG. 3 illustrates a typical and advantageous construction of the mesh jacket 12. In the illustration, the jacket is knitted of fine "MONEL" wire in the form of a continuous tube. It is to be understood, of course, that the invention is not limited by the particular construction of the conductive mesh.

Figure 5:
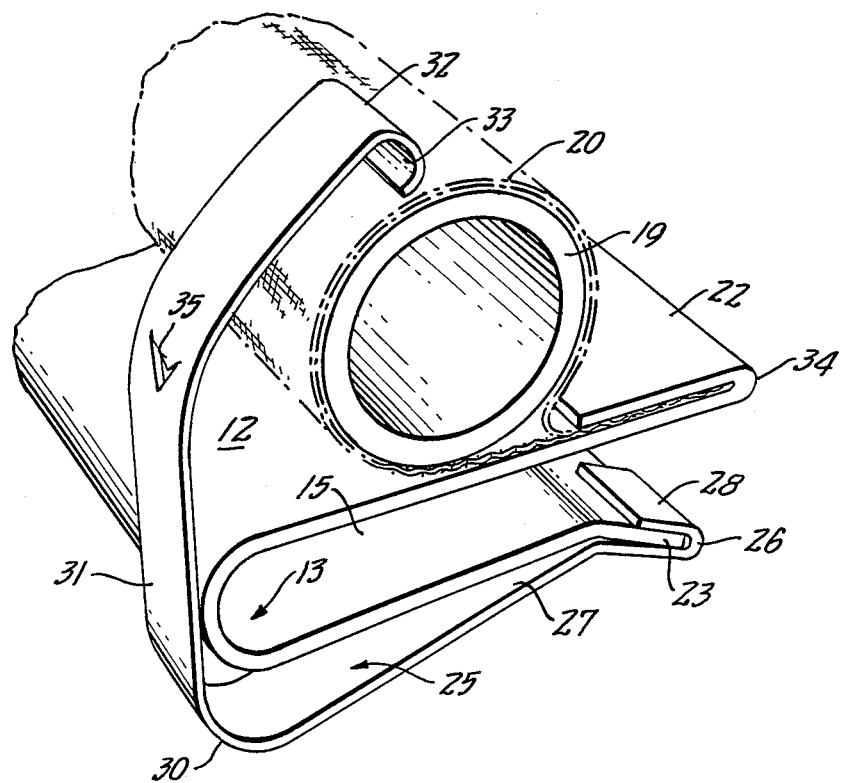
FIG. 5 is a perspective view, similar to FIG. 4, illustrating the first stage of installation of an end clip according to the invention.
Figure 6:
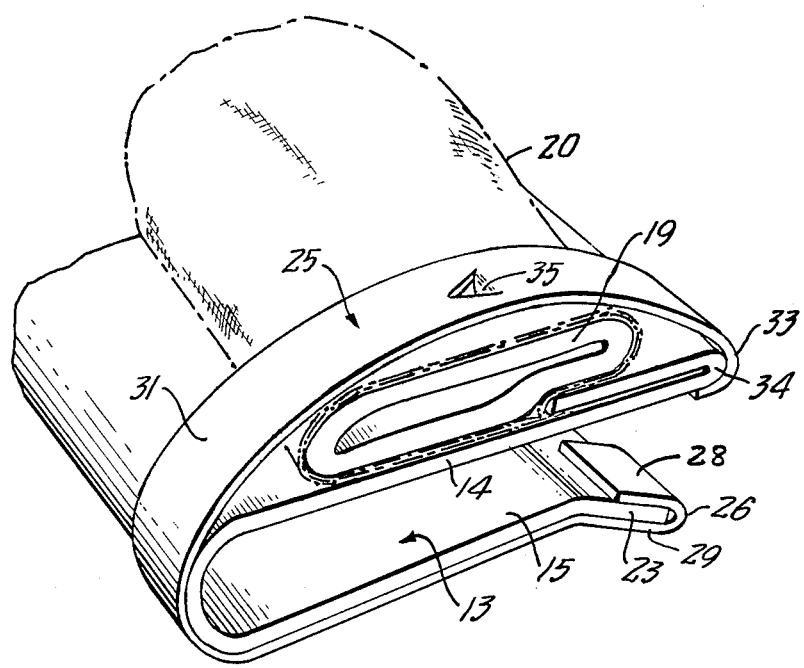
FIG. 6 is a perspective view, similar to FIG. 5, showing the end clip after installation on the cut end of the shielding strip.
Figure 7:
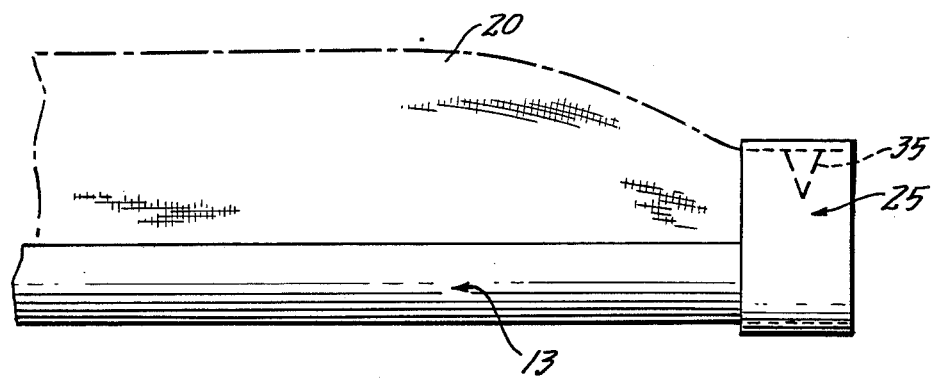
FIG. 7 is an elevational view of the shielding strip of FIG. 6, with the end clip installed thereon.

With reference now to FIGS. 5–7, the reference numeral 25 designates generally the end clip of the invention in one of its preferred embodiments. The clip is formed of a resilient, spring steel material, most advantageously a stainless steel, such as half hard 302 stainless. Desirable dimensions of the strip material are about 0.008 inch in thickness and 0.250 inch in width. The length of the strip is a function of the particular configuration of the mounting strip and mesh-clad core strip, as will be described.

In accordance with the invention, the end clip is adapted to be in effect "wrapped" about the end portion of a cut shielding strip. For this purpose, one end of the end clip, desirably the end 26 of its lower section 27, is pre-formed to provide a hook portion 28 adapted to be received over the divergent lower flange portion 23 of the mounting strip 13. Desirably, the end portion 26 of the terminating clip is divergently bent along a portion 29 corresponding generally to the divergent flange 23, so as to enable the lower section 27 of the clip to conform properly to the lower section 15 of the mounting strip.

The preformed clip is designed with a large radius curve 30 at its closed end, which joins with an upper section 31 formed with a downwardly concave contour and terminating at its outer end 32 in a preformed hook portion 33. The hook portion 33 is turned inwardly, and is of a suitable dimension (i.e., approximately 0.030 inch radius) to fit snugly about the outer edge 34 of the mounting strip 13.

In the assembly of the end clip to the shielding strip, the lower hook portion 28 advantageously is first mounted over the divergent flange 23, and then the clip is pushed upwardly and over the top of the mesh-clad core strip 19, depressing and deforming the core strip as necessary to allow the upper hook portion 33 to approach the outer edge 34 of the mounting strip. As the hook portion 33 reaches and extends around the edge 34, the pressure on the upper rear portions of the clip may be released, allowing the hook 33 to seat on the edge portion 34, as shown in FIG. 6. The end clip is now locked in place by the inherent resilient action of the clip itself, as well as by the upward pressure exerted by the compressed mesh-clad core strip 19.

To particular advantage, the length of the terminating clip 25 is such, in relation to the dimensions of the mounting strip 13 and the mesh-clad core strip 19, as to compress the core strip to approximately one-half its original height, when the end clip is in its fully installed position, shown in FIG. 6. By way of example, in a "small" size shielding clip, utilizing a mesh-clad core strip of about 0.310 initial diameter, the terminating clip 25 is designed to compress the core strip to a height of about 0.150. In a larger size unit, utilizing a mesh-clad core strip of about 0.410 inch diameter, the clip is designed to compress the core strip to a height of about 0.200 inch.

The manner in which the mesh-clad strip is compressed is illustrated particularly in FIG. 7. In this connection, it is necessary for the vertical profile of the terminating clip 25 to be sufficiently low as to accommodate compression of the mesh-clad strip when the door or access panel of the housing is closed. The shielding strip is designed such that the clad core strip is compressed over substantially its full length, about the periphery of the door 11, to assure good grounding and good shielding about the entire peripheral edge of the door.

While a low installed profile of the end clip 25 is important, it is also important that the clip not excessively compress the core strip 19, such as to completely close off the end of a hollow tube. Thus, where the resilient core is in the form of a hollow tube, it is necessary that provision be made for the inflow and outflow of air into the interior of the tube during opening and closing of the access door 11. If the ends of the tube are completely sealed off, or are unduly restricted, air pressure builds up internally of the tube and resists compression of the tube. This can cause excessive resistance to proper closing of the access door 11, considering the substantial peripheral area of the door which is subject to the resisting pressure of the mesh-clad tube. Excessive restriction also reduces resiliency of the tube by restricting the inflow of air into the interior when pressure is released. In general, compressing the core strip under the end clip by about 50% is about optimum.

To particular advantage, the upper arm 31 of the end clip is formed with a punched-out prong 35 (see FIG. 5). The prong 35 is positioned so as to directly overlie the mesh-clad strip 19 when the end clip is installed. The prong 35 extends in an inward direction, so as to penetrate through the mesh and into the material of the underlying core strip 19. This serves effectively to lock the end clip 25 against axial movement, that might otherwise allow it to be displaced off of the end of the shielding strip.

Figure 8:
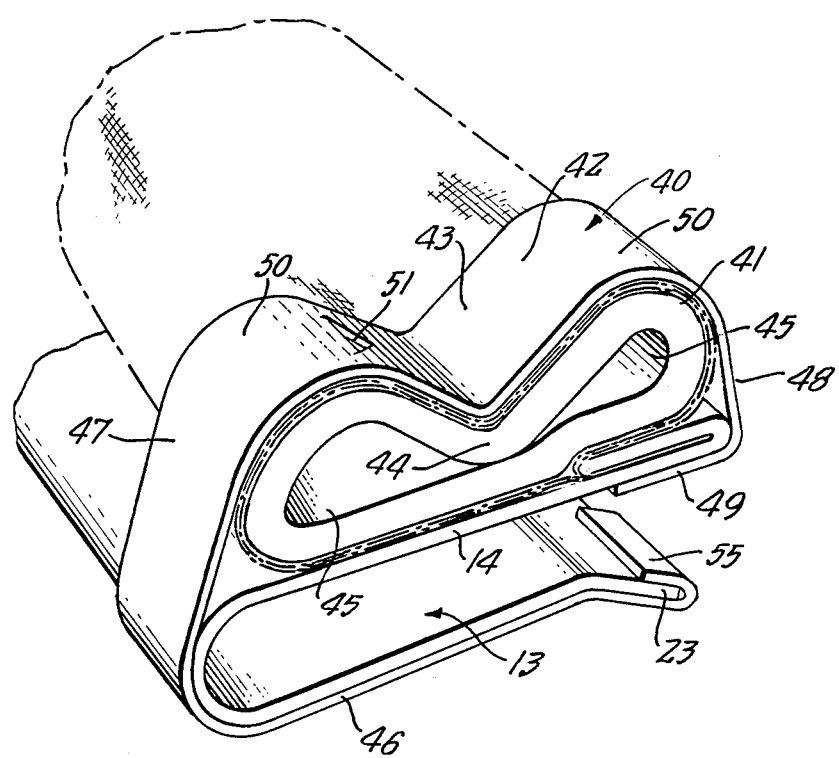
FIG. 8 is a perspective view, similar to FIG. 6, showing a modified form of end clip installed upon the cut section of shielding strip.

With reference now FIG. 8, there is shown an end clip 40 designed for use in connection with a mesh-clad core strip 41 of substantially larger diameter than the core strip 19 of FIGS. 5–7. In the illustration of FIG. 8, the clip-like mounting strip 13 may be of the same size and shape as the strip 13 of FIGS. 5–7. However, the core strip shown in FIG. 8 is of a diameter considerably larger, say 0.410 inch versus 0.310 inch. To accommodate this, the upper arm 42 of the terminating strip is provided with a somewhat different configuration, including a generally V-shaped central section 43 arranged to substantially compress the central section 44 of the core strip, while leaving ventilating openings 45 at each side for the ingress and egress of air from the interior of the tube. The lower arm 46 of the terminating clip may be basically of the construction as that described with reference to FIGS. 5–7. The upper section 42, on the other hand, has an overall, generally M-shaped configuration, including upwardly extending side portions 47, 48 and a return flange 49 at the outer or free end of the upper section 42, arranged to be snapped underneath the outer edge of the upper strip section 14.

In a preferred configuration of the end clip of FIG. 8, the V-shaped center section 43 may have an included angle of about 90 degrees, joining arcuate sections 50 of about 0.080 radius, for example. The apex of the V-shaped portion 43 is desirably blunt, having a radius of, say, 0.020 inch.

In its pre-form configuration, the clip of FIG. 8 is widely open, substantially as the clip of FIG. 5. Installation of the clip of FIG. 8 is, in general, the reverse of that of the clip of FIGS. 5-7. At the beginning, the return flange 49 is engaged under the upper section 14 of the mounting strip. The end clip is then wrapped around and over the mesh-clad tubing, and around the closed end of the mounting strip. Then, by deflecting and compressing the tubing, and pushing against the side portion 47 of the end clip, the lower return flange 55 is snapped over the lower, divergent flange portion 23 of the mounting strip. Because of this "reverse" method of application, as compared to the end of FIGS. 5-7, the lower return flange 55 may be somewhat shorter than the lower return flange 28 of the previously described embodiment. Likewise, the upper return flange 49 of the FIG. 8 embodiment is considerably longer than the hook portion 33 of the FIGS. 5-7 embodiment. This is to accommodate the fact that the "M-shaped" configuration of the FIG. 8 embodiment has portions 50, adjacent to the front edge of the shielding strip, which are subject to a considerable amount of displacement, if pressed.

The clip of FIG. 8 is also provided with a punched-out prong 51, similar in all respects to the prong 35 of the device of FIGS. 5-7.

In the assembled arrangement of FIG. 8, the mesh-clad core strip 41, which may be of about 0.410 inch diameter, is compressed by the end clip to approximately 0.200 inch in height. This allows ample clearance for compression of the main body of the mesh-clad strip by the access door 11, while at the same time allowing for adequate inflow and outflow of air through the end openings 45.

As will be evident in the drawings, the end clip device of the invention provides for a highly attractive end configuration for the severed lengths of the mesh-clad shielding strips. Whereas a conventional severed shielding strip, whether or not coated with a plastic material, will be somewhat frayed and expanded, and perhaps will have a few projecting wire ends, all of that is fully concealed by the end clip of the invention. The ragged wire ends are contained underneath the end clip and all that is visible to the eye are the neat, clean lines of the clip itself. The end clip is easily and quickly installed by being simply "wrapped" around the cut end of the shielding strip and "snapped" over the edge of the mounting strip.

A particularly advantageous feature of the invention resides in the fact that the end extremity of the mesh-clad tubing is positively secured against displacement. It is thus effectively impossible for the end of the mesh-clad tubing to be snagged and torn in use.

Although there is of course a minor cost involved in the manufacture and installation of the end clip, such costs are in most cases less than those involved with applying a proper plastic coating to the end of the shielding strip because of the nature of the material that has to be applied, its required curing time, and the need to keep the end of the tubing open for the inflow and outflow of air. In all cases, moreover, the result is a far superior, more professional appearing structure, which is especially desirable for the application intended.

It should be understood, of course, that the specific form of the invention herein illustrated and described is intended to be representative only, as certain changes may be made therein without departing from the clear teachings of the disclosure. Accordingly, reference should be made to the following appended claims in determining the full scope of the invention.

I claim:

1. An end clip especially designed and adapted for mounting on a mesh-clad RFI/EMI shielding strip, the strip being of the type including an elongated clip-like mounting strip of generally U-shaped cross section having upper and lower strip sections joined at one side and having free edges at the opposite side, the free edge of the lower strip section of said mounting strip being divergently angled with respect to the remainder of said strip section, an elongated resilient core strip secured to and extending along the upper strip section of said mounting strip, and a conductive mesh surrounding said core strip throughout its length, said end clip being characterized by
   (a) being formed of an elongated strip of thin, resilient material of substantially greater length than width and of substantially greater width than thickness,
   (b) having a generally flat lower section and a generally arcuate upper section with a downwardly concave configuration,
   (c) having at its opposite end extremities short, upper and lower hook-like portions adapted to engage the free edges of the respective upper and lower strip sections of the mounting strip when installed thereon;
   (d) having adjacent said lower hook-like portion, a divergently angled portion adapted to conform substantially to the divergently angled free edge of the lower strip section of the mounting strip when installed thereon,
   (e) having a length, between said hook-like portions, slightly greater than the outer peripheral dimension of the U-shaped mounting strip of the shielding strip, and
   (f) the length of said end clip being such, in relation to the cross sectional configuration of the shielding strip on which it is to be installed, as to cause the core strip and mesh of such shielding strip to be deformed and confined at a reduced height by said end clip when said end clip is engaged at both of its ends with the mounting strip of the shielding strip.

2. An end clip according to claim 1, further characterized by
   (a) said thin, resilient material being metal, and
   (b) having a punched-out element in a portion thereof positioned to overlie said core strip and mesh, when said clip is installed on the shielding strip, said punched-out element projecting inwardly and being adapted to engage the mesh and core strip of the shielding strip, when the clip is installed thereon, whereby to secure said clip against axial movement on the shielding strip.

3. A mesh-clad RFI/EMI shielding strip assembly which comprises
   (a) an elongated clip-like mounting strip of generally U-shaped cross section having upper and lower strip sections joined at one side and open at the opposite side for application to an electronic housing panel or the like,
(b) an elongated resilient core strip secured to and extending along the upper section of said mounting strip,
(c) a conductive mesh cover surrounding said core strip throughout its length and secured in electrically conducting relation to said mounting strip, and
(d) an end clip secured to the said mounting strip for confining the end of said core strip and mesh,
(e) said end clip comprising an elongated, thin strip or resilient material formed with hook-like portions at each end engaged with the open side edges of said mounting strip,
(f) said end clip being engaged at one end with said mounting strip and wrapped around said mounting strip and said core strip and engaged at the other end with said mounting strip, and
(g) the length of said end clip being such, in relation to the peripheral dimensions of said mounting strip and the cross sectional dimensions of said core strip that with said end clip so engaged at both ends to said mounting strip, said core strip is compressed to about one-half or less of its original height.

4. A mesh-clad RFI/EMI shielding strip assembly according to claim 3, further characterized by
(a) said core strip comprising a hollow resilient tube, and
(b) the length dimensions of said end clip being such, in relation to the cross sectional configuration of said mounting strip and said core strip that said hollow core strip remains at least partially open at the end to accommodate the relatively free inflow and outflow of air to and from the interior of said core strip.

5. A mesh-clad RFI/EMI shielding strip assembly according to claim 3, further characterized by
said end clip being pre-formed with a generally V-shaped indentation in its upper portion/bearing upon a central portion of said core strip.

6. A mesh-clad RFI/EMI shielding strip assembly according to claim 3, further characterized by
said mesh cover being formed of knitted metallic threads.

7. A mesh-clad RFI/EMI shielding strip assembly according to claim 3, further characterized by
said end clip being formed on its upper portion with a punched-out, tab-like element non-displaceably engaging said mesh cover.

* * * * *